US012724330B2

(12) United States Patent
Ouyang

(10) Patent No.: US 12,724,330 B2
(45) Date of Patent: Sep. 1, 2026

(54) WATER-COOLED HEAT DISSIPATION STRUCTURE APPLIED TO UNDERWATER PHOTOGRAPHIC EQUIPMENT

(71) Applicant: Dongguan Miles Precision Manufacturing Co., Ltd, Dongguan (CN)

(72) Inventor: Jun Ouyang, Dongguan (CN)

(73) Assignee: Dongguan Miles Precision Manufacturing Co., Ltd, Dongguan (CN)

( * ) Notice: Subject to any disclaimer, the term of this patent is extended or adjusted under 35 U.S.C. 154(b) by 112 days.

(21) Appl. No.: 18/986,739

(22) Filed: Dec. 19, 2024

(65) Prior Publication Data

US 2026/0147258 A1 May 28, 2026

(30) Foreign Application Priority Data

Nov. 28, 2024 (CN) ......................... 202411735450.5
Nov. 28, 2024 (CN) ......................... 202422931484.3

(51) Int. Cl.

*G03B 17/55* (2021.01)
*G03B 17/08* (2021.01)
*H04N 23/52* (2023.01)
*H05K 7/20* (2006.01)

(52) U.S. Cl.

CPC ............. *G03B 17/55* (2013.01); *G03B 17/08* (2013.01); *H04N 23/52* (2023.01); *H05K 7/20272* (2013.01); *H05K 7/20281* (2013.01)

(58) Field of Classification Search

CPC ........ H04N 23/52; G03B 17/08; G03B 17/55; H05K 7/20272; H05K 7/20281
See application file for complete search history.

(56) References Cited

U.S. PATENT DOCUMENTS

2002/0001463 A1* 1/2002 Inoue ..................... G03B 17/08 396/28
2003/0214593 A1* 11/2003 Takematsu ............. G03B 15/05 348/E5.029
2018/0231875 A1* 8/2018 Zanganeh .............. G03B 15/00

FOREIGN PATENT DOCUMENTS

WO WO-2022054412 A1 * 3/2022 ............. G03B 17/02

* cited by examiner

*Primary Examiner* — Daniel M Pasiewicz

(57) ABSTRACT

The present disclosure discloses a water-cooled heat dissipation structure applied to underwater photographic equipment, including a waterproof case and a water-cooled heat dissipation mechanism, wherein a cavity is disposed in the waterproof case; the water-cooled heat dissipation mechanism includes a control module, a pump body and a pipe body, wherein the control module is electrically connected to the pump body; the pipe body is disposed in the cavity; a water inlet end of the pipe body penetrates through the waterproof case and is connected to the pump body; and a water outlet end of the pipe body penetrates through and extends outside the waterproof case. The pump body can draw water into the pipe body via the water inlet end and water flow out from the water outlet end, improving the heat dissipation performance of the camera and ensuring the normal use of the camera for a long time.

10 Claims, 6 Drawing Sheets

WATER-COOLED HEAT DISSIPATION STRUCTURE APPLIED TO UNDERWATER PHOTOGRAPHIC EQUIPMENT

CROSS REFERENCE TO RELATED APPLICATIONS

The present application claims the benefit of Chinese Patent Application Nos. 202422931484.3 and 202411735450.5 filed on Nov. 28, 2024. All the above are hereby incorporated by reference in their entirety.

TECHNICAL FIELD

The present disclosure belongs to the field of photographic equipment, and particularly relates to a water-cooled heat dissipation structure applied to underwater photographic equipment.

BACKGROUND ART

At present, it is more and more common to use a camera to perform photography under water. In order to avoid seepage of water-proof shell of the camera, it is usually vacuumized, so that the camera is in a vacuum environment for a long time when performing photography under water. When the camera is used in the vacuum environment, there is a problem that the internal heat dissipation is insufficient. When the temperature is too high, it may affect the normal use of the product, resulting in a shortened shooting time.

SUMMARY OF THE INVENTION

In order to solve the above-mentioned problems, it is an object of the present disclosure to provide a water-cooled heat dissipation structure applied to underwater photographic equipment, which can improve the heat dissipation performance of a camera and ensure that the camera can be normally used under water for a long time.

In order to achieve the object, the invention adopts the following technical solution.

The present disclosure provides a water-cooled heat dissipation structure applied to underwater photographic equipment, including a waterproof case and a water-cooled heat dissipation mechanism, wherein a cavity is disposed in the waterproof case; the water-cooled heat dissipation mechanism includes a control module, a pump body and a pipe body, wherein the control module is electrically connected to the pump body; the pipe body is disposed in the cavity; a water inlet end of the pipe body penetrates through the waterproof case and is connected to the pump body; and a water outlet end of the pipe body penetrates through and extends outside the waterproof case. When the camera is used underwater, the pump body can draw water into the pipe body via the water inlet end, and then water flow out from the water outlet end, realizing the circulation flow of the water body in the waterproof case and is performing the heat exchange by the pipe body, which continuously takes away the heat generated by the camera, cools the camera in the waterproof case, improves the heat dissipation performance of the camera, and ensures that the camera can be used normally for a long time.

Further, the control module and the pump body are disposed outside the waterproof case.

Further, the water-cooled heat dissipation mechanism further includes a support plate fixedly disposed in the cavity; and the pipe body is fixed to the support plate. In the present application, the support plate can be used for fixing the pipe body and improving the structural stability of the pipe body. In addition, it can be attached to the camera as a heat conducting member to increase the heat exchange area of the camera and improve the heat dissipation effect.

Further, the pipe body has a "U"-shaped structure, and a side of the "U"-shaped structure is fitted to a surface of the support plate.

Further, the waterproof case is provided with a first through hole; the water inlet end penetrates through the first through hole; and a first seal is further disposed between the first through hole and the water inlet end.

Further, the waterproof case is provided with a second through hole; the water outlet end passes through the second through hole; and a second seal is further disposed between the second through hole and the water outlet end.

Further, each of the first seal and the second seal includes a connecting body and a sealing ring; the connecting body is threadedly connected with the first through hole and the second through hole; the connecting body is provided with a through hole; the water inlet end and water outlet end penetrate through the through hole; and the sealing ring is disposed between the through hole and the water inlet end and water outlet end.

Further, the water-cooled heat dissipation mechanism further includes a power supply module, a first electrical connection line and a second electrical connection line; the power supply module is connected to the control module via the first electrical connection line; and the control module is connected to the pump body via the second electrical connection line.

Further, the water-cooled heat dissipation mechanism includes a bottom shell, a first surface cover, a second surface cover and a third surface cover; the bottom shell is disposed outside the waterproof case and is fixedly connected to the waterproof case; a first mounting chamber is disposed between the bottom shell and the first surface cover, and the pump body is disposed in the first mounting chamber; a second mounting chamber is disposed between the bottom shell and the second surface cover, and the control module is disposed in the second mounting chamber; and a third mounting chamber is disposed between the bottom shell and the third surface cover, and the power supply module is disposed in the third mounting chamber.

Further, the first, second and third surface covers are detachably connected to the bottom shell; and a sealing ring is disposed between the second and third surface covers and the bottom shell.

Further, the side wall of the first mounting chamber is provided with two hole positions, an inlet of the pump body protrudes out of the mounting case by one of the hole positions, and an outlet of the pump body is connected to the water inlet end of the pipe body via the other hole position.

Further, the control module includes a control circuit board and a control button; the control circuit board is disposed in the second mounting chamber; the second surface cover is provided with a limiting slot, a bottom wall of the limiting slot is provided with a movable hole in communication with the second mounting chamber, and the control circuit board is provided with a control key; and the control button is movably disposed in the limiting slot, and a lower end of the control button movably penetrates through the movable hole to above the control key.

Further, the control button includes a pressing portion and a rod body; the pressing portion is movably disposed in the limiting slot and exposed outside the second surface cover; the rod body movably penetrates through the movable hole, one end of the rod body is fixedly connected to the pressing portion, and the other end thereof extends above the control key; and an elastic member is further sleeved on the rod body, one end of the elastic member abuts against or is connected to a surface of the pressing portion facing towards the limiting slot, and the other end abuts against a bottom wall of the limiting slot.

Further, a sealing ring is disposed between the rod body and the movable hole to seal the second mounting chamber.

Compared to the prior art, the advantageous effects of the present disclosure are as follows. By mounting the water-cooled heat dissipation mechanism on the waterproof case of the underwater photographic equipment, when the camera is used underwater, the pump body can draw water into the pipe body via the water inlet end, and then water flow out from the water outlet end, realizing the circulation flow of the water body in the waterproof case and is performing the heat exchange by the pipe body, which continuously takes away the heat generated by the camera, cools the camera in the waterproof case, improves the heat dissipation performance of the camera, and ensures that the camera can be used normally for a long time.

Figure 1:
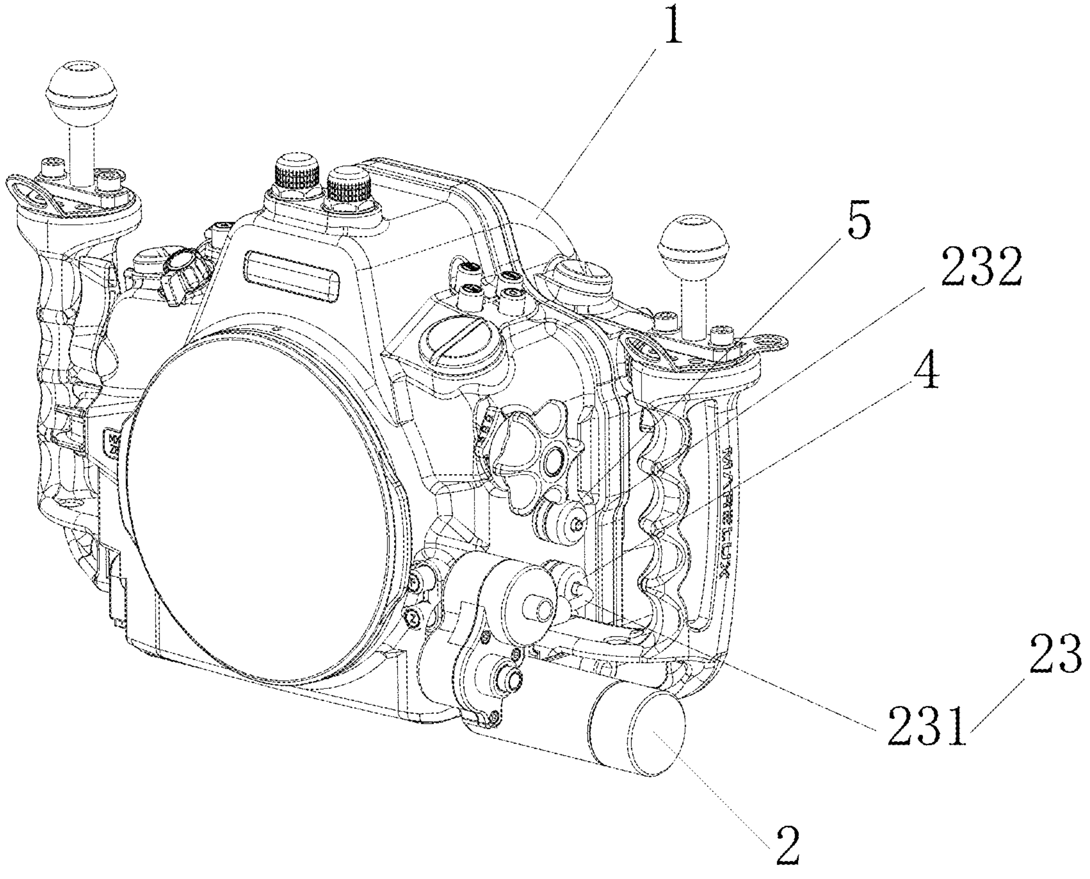
FIG. 1 is a structurally schematic view of the water-cooled heat dissipation structure.

In the drawings, 1, waterproof case; 11, first through hole; 12, second through hole; 2, water-cooled heat dissipation mechanism; 21, control module; 211, control circuit board; 212, control button; 2121, pressing portion; 2122, rod body; 213, control key; 214, elastic member; 22, pump body; 23, pipe body; 231, water inlet end; 232, water outlet end; 24, support plate; 25, power supply module; 26, first electrical connection line; 27, second electrical connection line; 28, bottom shell; 29, first surface cover; 210, second surface cover; 220, third surface cover; 230, first mounting chamber; 240, second mounting chamber; 250, third mounting chamber; 260, limiting slot; 270, movable hole; 280, connecting plate; 3, cavity; 4, first seal; 41, connecting body; 42, sealing ring; 43, sealing cap; 5, second seal.

DETAILED DESCRIPTION OF THE INVENTION

In order that the objects, aspects and advantages of the present disclosure will become more apparent, a more particular description of the invention will be rendered by reference to the appended drawings and the embodiments. It should be understood that the specific embodiments described herein are illustrative only and are not limiting the invention.

In order to achieve the purpose, the invention adopts the following technical solution.

With reference to FIG. 1, the present embodiment provides a water-cooled heat dissipation structure applied to underwater photographic equipment, including a waterproof case 1 and a water-cooled heat dissipation mechanism 2, wherein a cavity 3 is disposed in the waterproof case 1, and the cavity 3 is a vacuum cavity for mounting an underwater camera to waterproof and protect the camera.

Figure 3:
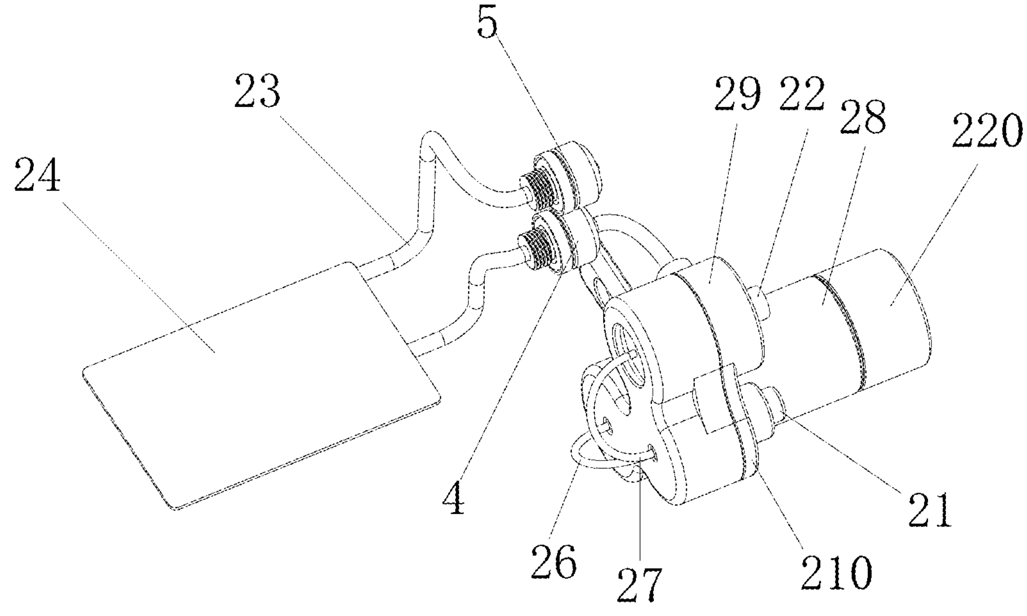
FIG. 3 is a structurally schematic view of a water-cooled heat dissipation mechanism.
Figure 4:
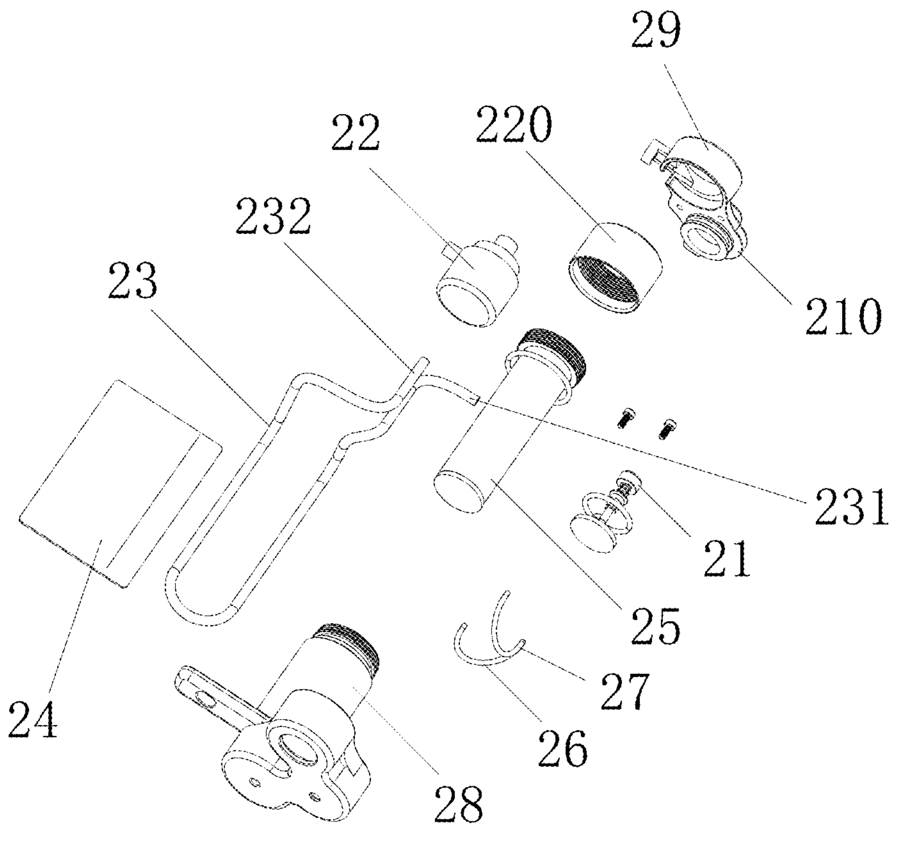
FIG. 4 is an exploded view of the water-cooled heat dissipation mechanism.

Further, with reference to FIGS. 3 and 4, the water-cooled heat dissipation mechanism 2 includes a control module 21, a pump body 22 and a pipe body 23, and the control module 21 is electrically connected to the pump body 22. The pipe body 23 is disposed in the cavity 3. The water inlet end 231 of the pipe body 23 penetrates through the waterproof case 1 and is connected to the pump body 22, and the water outlet end 232 of the pipe body 23 penetrates through and extends outside the waterproof case 1. When the camera is used underwater, the pump body 22 can draw water into the pipe body 23 via the water inlet end 231, and then water flow out from the water outlet end 232, realizing the circulation flow of the water body in the waterproof case 1 and performing heat exchange via the pipe body 23, which continuously removes the heat generated by the camera, cools the camera in the waterproof case 1, improves the heat dissipation performance of the camera, and ensures that the camera can be normally used for a long time.

Further, the control module 21 and the pump body 22 are disposed outside the waterproof case 1, so that the volume of the waterproof case can be reduced and convenient to use.

Further, the water-cooled heat dissipation mechanism 2 further includes a support plate 24. The support plate 24 is fixedly disposed in the cavity 3 and is fixed with the waterproof case 1. The pipe body 23 is fixed on the support plate 24. In the present embodiment, the support plate 24 can be used for fixing the pipe body 23 and improving the structural stability of the pipe body 23. In addition, it can be attached to the camera as a heat conducting member to increase the heat exchange area of the camera and improve the heat dissipation effect.

Further, the pipe body 23 has a "U"-shaped structure. The both ends of the "U"-shaped structure are a water inlet end 231 and a water outlet end 232, respectively. The support plate 24 is arranged horizontally, and the "U"-shaped structure is arranged horizontally, so that the side face with a larger area thereof is adhered to the surface of the support plate 24, which can increase the contact area with the support plate 24 and improve the effect of water cooling and heat exchange.

Further, the pipe body 23 is made of a metal tube, and the support plate 24 is made of a metal material with better heat dissipation performance, with higher thermal conductivity and heat exchange effect.

Figure 2:
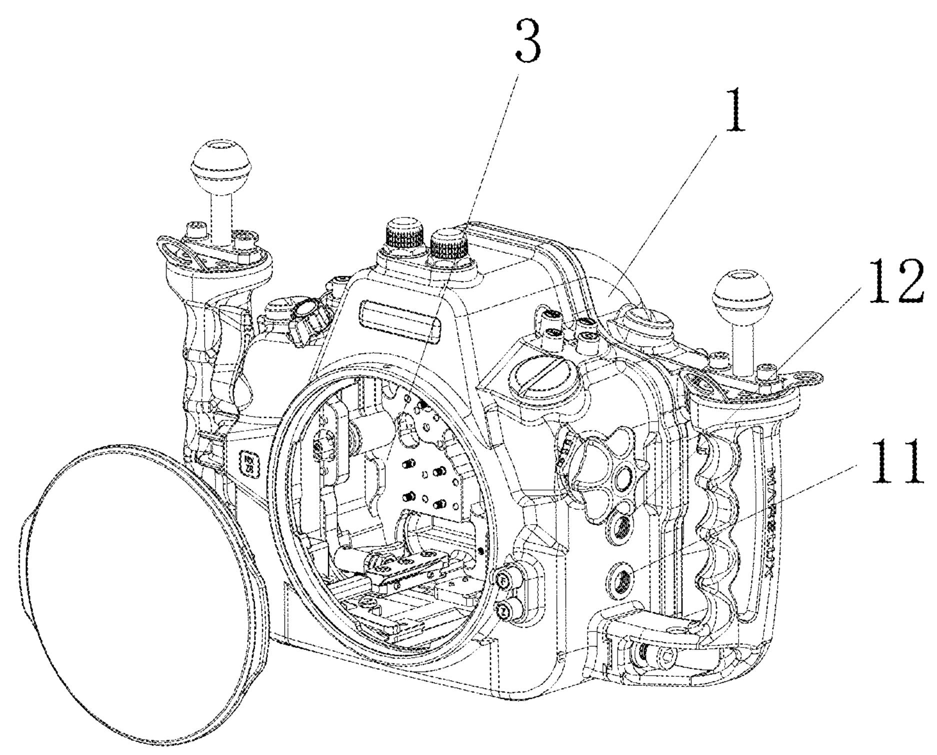
FIG. 2 is a structurally schematic view of a waterproof case.

Further, with reference to FIG. 2, a first through hole 11 is disposed on the waterproof case 1, the water inlet end 231 penetrates through the first through hole 11, and a first seal 4 is further disposed between the first through hole 11 and the water inlet end 231.

Further, the waterproof case 1 is provided with a second through hole 12, the water outlet end 232 penetrates through the second through hole 12, and a second seal 5 is further disposed between the second through hole 12 and the water outlet end 232.

Figure 9:
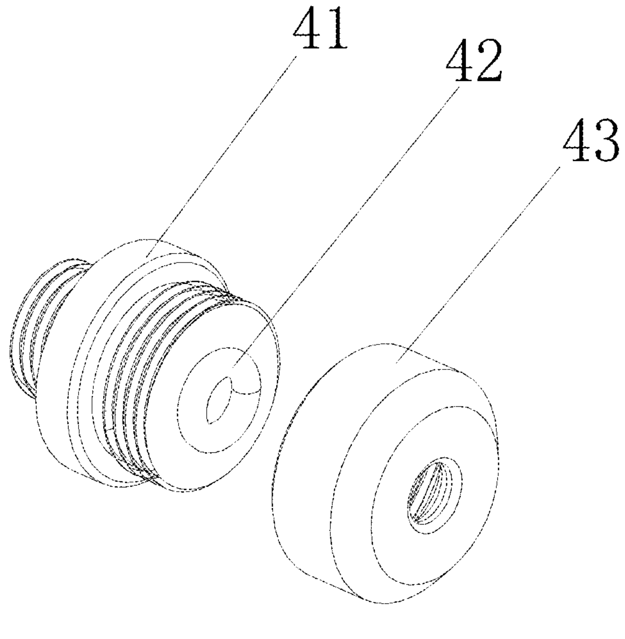
FIG. 9 is an exploded view of a first seal.

Further, with reference to FIG. 9, the first seal 4 includes a connecting body 41, a sealing ring 42 and a sealing cap 43, wherein one end of the connecting body 41 is threadedly connected with the sealing cap 43, and the other end thereof is threadedly connected with the first through hole 11 and the second through hole 12. The sealing ring 42 is disposed between the connecting body 41 and the sealing cap 43. A via hole is formed on the connecting body 41 and the sealing cap 43. The water inlet end 231 and the water outlet end 232 penetrate through the via hole, and the sealing ring 42 is disposed between the via hole and the water inlet end 231 and the water outlet end 232. The above-mentioned structural arrangement can facilitate the assembly and disassembly of the first seal 4 and the second seal 5, and further facilitate the installation of the pipe body 23. The first through hole 11 and the second through hole 12 can be sealed by the sealing ring 42 to ensure the sealing performance of the waterproof case 1.

Specifically, the first seal 4 and the second seal 5 have the same structure.

Further, with reference to FIGS. 3 and 4, the water-cooled heat dissipation mechanism 2 further includes a power supply module 25, a first electrical connection line 26 and a second electrical connection line 27, wherein the power supply module 25 is connected to the control module 21 via the first electrical connection line 26, and the control module 21 is connected to the pump body 22 via the second electrical connection line 27. The power supply module 25 can independently supply power to the pump body 22, so that the water-cooled heat dissipation mechanism 2 can be used independently, and does not rely on a camera to supply power, so as to conveniently arrange the water-cooled heat dissipation mechanism outside the waterproof case 1, and further facilitate the introduction of external water into the waterproof case 1 to cool the camera.

Specifically, the power supply module 25 adopts standard batteries to power the pump body 22.

Figure 5:
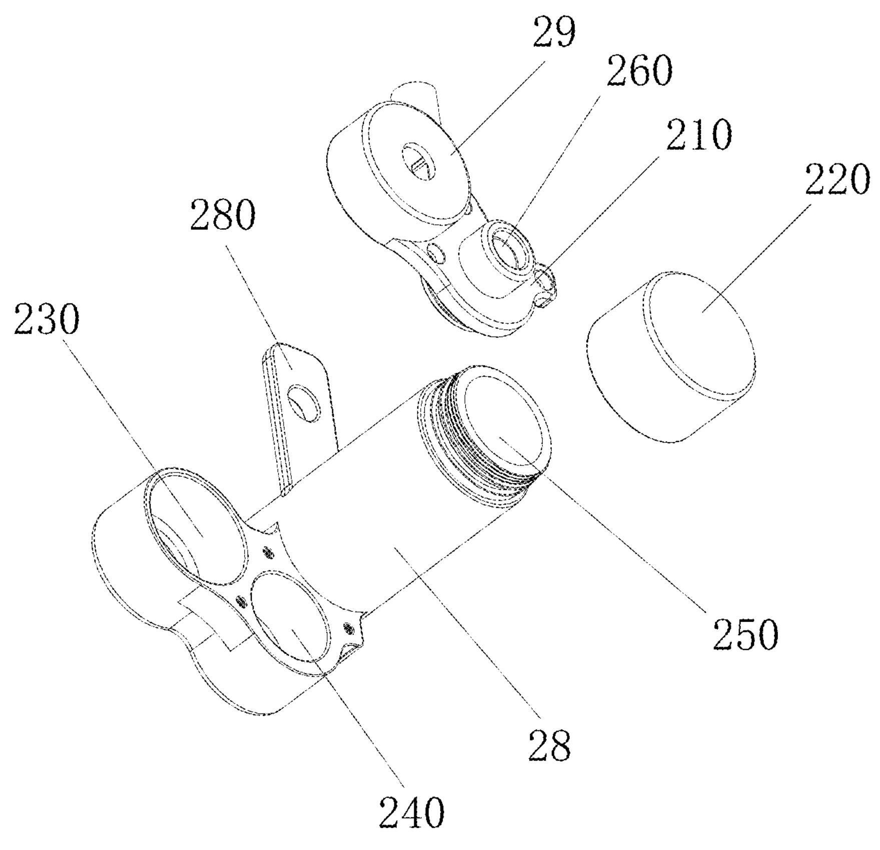
FIG. 5 is a structurally schematic view of a bottom shell, a first surface cover, a second surface cover, and a third surface cover.

Further, with reference to FIG. 5, the water-cooled heat dissipation mechanism 2 further includes a bottom shell 28, a first surface cover 29, a second surface cover 210 and a third surface cover 220. The first surface cover 29 is integrally formed with the second surface cover 210. The bottom shell 28 is disposed outside the waterproof case 1, and a connecting plate 280 is disposed and fixedly connected to the waterproof case 1. A first mounting chamber 230 is disposed between the bottom shell 28 and the first surface cover 29, and the pump body 22 is disposed in the first mounting chamber 230. A second mounting chamber 240 is disposed between the bottom shell 28 and the second surface cover 210, and the control module 21 is disposed in the second mounting chamber 240. A third mounting chamber 250 is disposed between the bottom shell 28 and the third surface cover 220, and the power supply module 25 is disposed in the third mounting chamber 250.

Further, the first surface cover 29, the second surface cover 210 and the third surface cover 220 are all detachably connected to the bottom shell 28, and a sealing ring is disposed between the second surface cover 210, the third surface cover 220 and the bottom shell 28. In the present embodiment, the first surface cover 29, the second surface cover 210 and the bottom shell 28 are connected via rivets. The inner side of the third surface cover 220 is provided with an internal thread. The corresponding position of the bottom shell 28 is provided with an external thread matched with the internal thread, and the third surface cover 220 is threadedly connected with the bottom shell 28. The above-mentioned structure can achieve the dismounting between the first surface cover 29, the second surface cover 210, the third surface cover 220 and the bottom shell 28, and can facilitate the installation of the pump body 22, the power supply module 25 and the control module 21. The sealing ring can waterproof seal the second mounting chamber 240 and the third mounting chamber 250 to ensure the safe use of the control module 21 and the power supply module 25.

Further, the side wall of the first mounting chamber 230 is provided with two hole positions, an inlet of the pump body 22 protrudes out of the mounting housing by one of the hole positions, and an outlet of the pump body 22 is connected to the water inlet end 231 of the pipe body 23 via the other hole position.

Figure 6:
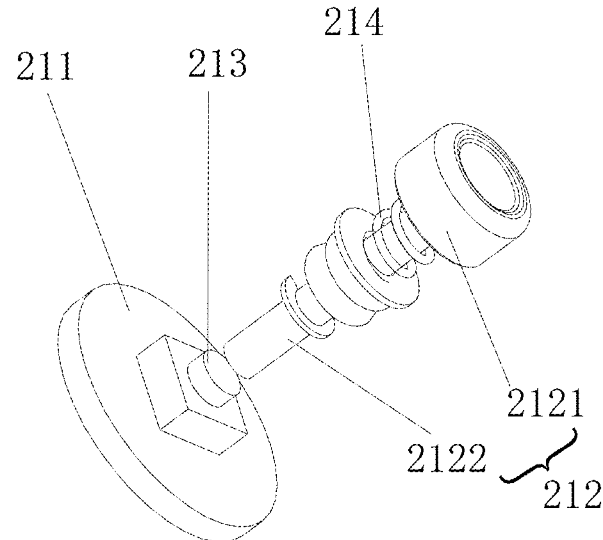
FIG. 6 is a structurally schematic view of a control module.
Figure 7:
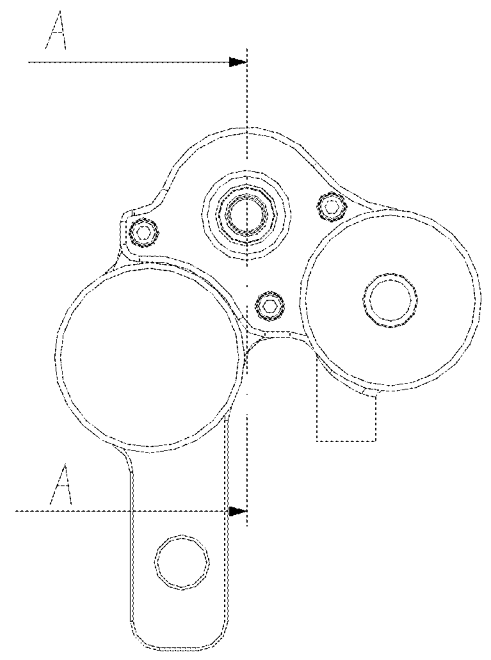
FIG. 7 is a side view of the water-cooled heat dissipation mechanism.
Figure 8:
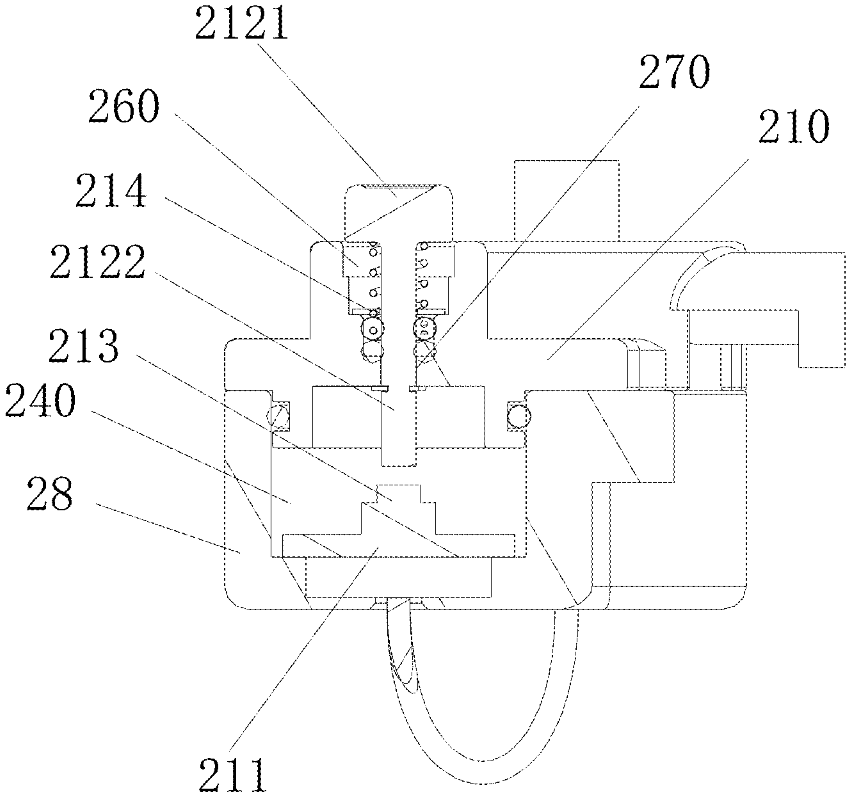
FIG. 8 is a cross-sectional view at A-A in FIG. 7.

Further, with reference to FIGS. 6-8, the control module 21 includes a control circuit board 211 and a control button 212. The control circuit board 211 is disposed in the second mounting chamber 240. The second surface cover 210 is provided with a limiting slot 260. The bottom wall of the limiting slot 260 is provided with a movable hole 270 in communication with the second mounting chamber 240. The control circuit board 211 is provided with a control key 213. The control button 212 is movably disposed in the limiting slot 260, and the lower end of the control button 212 movably extends through the movable hole 270 to above the control key 213.

Further, the control button 212 includes a pressing portion 2121 and a rod body 2122. The pressing portion 2121 is movably disposed in the limiting slot 260 and exposed outside the second surface cover 210. The rod body 2122 movably penetrates through the movable hole 270. One end of the rod body 2122 is fixedly connected to the pressing portion 2121, and the other end extends above the control key 213. An elastic member 214 is further sleeved on the rod body 2122. One end of the elastic member 214 abuts against or is connected to a surface of the pressing portion 2121 facing towards the limiting slot 260, and the other end abuts against the bottom wall of the limiting slot 260. In the present embodiment, the rod body 2122 is pushed to move downwards by pressing the exposed pressing portion 2121. After the rod body 2122 touches the control key 213, the trigger of the key 213 can be controlled to switch the pump body 22 on or off. When the pressing portion 2121 is released, the entire control button 212 can be reset away from the control button 213 by the elastic force of the elastic member 214.

Further, a sealing ring is disposed between the rod body 2122 and the movable hole 270 to seal the second mounting chamber 240.

The foregoing is only preferred embodiments of the invention and is not intended to limit the invention. Any modifications, equivalents, and improvements within the spirit and principles of the invention are intended to be included within the scope of this invention.

The invention claimed is:

1. A water-cooled heat dissipation structure applied to underwater photographic equipment, comprising a waterproof case and a water-cooled heat dissipation mechanism, wherein a cavity is disposed in the waterproof case; the water-cooled heat dissipation mechanism comprises a control module, a pump body and a pipe body, wherein the control module is electrically connected to the pump body; the pipe body is disposed in the cavity; a water inlet end of the pipe body penetrates through the waterproof case and is connected to the pump body; and a water outlet end of the pipe body penetrates through and extends outside the waterproof case.

2. The water-cooled heat dissipation structure applied to underwater photographic equipment according to claim 1, wherein the control module and the pump body are disposed outside the waterproof case.

3. The water-cooled heat dissipation structure applied to underwater photographic equipment according to claim 1, wherein the water-cooled heat dissipation mechanism further comprises a support plate fixedly disposed in the cavity; and the pipe body is fixed to the support plate.

4. The water-cooled heat dissipation structure applied to underwater photographic equipment according to claim 1, wherein the waterproof case is provided with a first through hole; the water inlet end penetrates through the first through hole; and a first seal is further disposed between the first through hole and the water inlet end.

5. The water-cooled heat dissipation structure applied to underwater photographic equipment according to claim 4, wherein the waterproof case is provided with a second through hole; the water outlet end passes through the second through hole; and a second seal is further disposed between the second through hole and the water outlet end.

6. The water-cooled heat dissipation structure applied to underwater photographic equipment according to claim 5, wherein each of the first seal and the second seal comprises a connecting body and a sealing ring; the connecting body is threadedly connected with the first through hole and the second through hole; the connecting body is provided with a through hole; the water inlet end and water outlet end penetrate through the through hole; and the sealing ring is disposed between the through hole and the water inlet end and water outlet end.

7. The water-cooled heat dissipation structure applied to underwater photographic equipment according to claim 1, wherein the water-cooled heat dissipation mechanism further comprises a power supply module, a first electrical connection line and a second electrical connection line; the power supply module is connected to the control module via the first electrical connection line; and the control module is connected to the pump body via the second electrical connection line.

8. The water-cooled heat dissipation structure applied to underwater photographic equipment according to claim 7, wherein the water-cooled heat dissipation mechanism comprises a bottom shell, a first surface cover, a second surface cover and a third surface cover; the bottom shell is disposed outside the waterproof case and is fixedly connected to the waterproof case; a first mounting chamber is disposed between the bottom shell and the first surface cover, and the pump body is disposed in the first mounting chamber; a second mounting chamber is disposed between the bottom shell and the second surface cover, and the control module is disposed in the second mounting chamber; and a third mounting chamber is disposed between the bottom shell and the third surface cover, and the power supply module is disposed in the third mounting chamber.

9. The water-cooled heat dissipation structure applied to underwater photographic equipment according to claim 8, wherein the control module comprises a control circuit board and a control button; the control circuit board is disposed in the second mounting chamber; the second surface cover is provided with a limiting slot, a bottom wall of the limiting slot is provided with a movable hole in communication with the second mounting chamber, and the control circuit board is provided with a control key; and the control button is movably disposed in the limiting slot, and a lower end of the control button movably penetrates through the movable hole to above the control key.

10. The water-cooled heat dissipation structure applied to underwater photographic equipment according to claim 9, wherein the control button comprises a pressing portion and a rod body; the pressing portion is movably disposed in the limiting slot and exposed outside the second surface cover; the rod body movably penetrates through the movable hole, one end of the rod body is fixedly connected to the pressing portion, and the other end thereof extends above the control key; and an elastic member is further sleeved on the rod body, one end of the elastic member abuts against or is connected to a surface of the pressing portion facing towards the limiting slot, and the other end abuts against a bottom wall of the limiting slot.

* * * * *